United States Patent [19]

Kasuga et al.

[11] 4,186,281

[45] Jan. 29, 1980

[54] MULTICHANNEL RECORD DISC REPRODUCING APPARATUS

[75] Inventors: Masao Kasuga, Sagamihara; Nobuaki Takahashi, Yamato; Fujio Suzuki; Yoshiki Iwasaki, both of Yokohama, all of Japan

[73] Assignee: Victor Company of Japan, Ltd., Yokohama, Japan

[21] Appl. No.: 843,863

[22] Filed: Oct. 20, 1977

[30] Foreign Application Priority Data

Oct. 22, 1976 [JP] Japan ................................ 51-126929
Nov. 25, 1976 [JP] Japan ................................ 51-141700

[51] Int. Cl.$^2$ .......................... G11B 3/00; H03D 3/00

[52] U.S. Cl. ....................... 179/100.4 ST; 179/1 GQ; 179/100.1 TD

[58] Field of Search ............ 179/100.4 ST, 100.1 TD, 179/1 GQ, 15 BT, 100.4 M; 329/122, 123, 124; 325/419, 421, 423; 331/23, 25

[56] References Cited

U.S. PATENT DOCUMENTS

| | | | |
|---|---|---|---|
| 3,896,272 | 7/1975 | Takahashi et al. | 179/100.4 ST |
| 3,909,735 | 9/1975 | Anderson et al. | 329/122 |
| 3,934,087 | 1/1976 | Takahashi et al. | 179/100.4 ST |
| 3,936,618 | 2/1976 | Takahashi et al. | 179/100.4 ST |
| 3,991,283 | 11/1976 | Itoh et al. | 179/100.4 ST |
| 4,096,360 | 6/1978 | Takahashi et al. | 179/100.4 ST |

*Primary Examiner*—Bernard Konick
*Assistant Examiner*—Donald McElheny, Jr.

[57] ABSTRACT

A multichannel record disc reproducing apparatus comprises a first phase locked loop circuit including a phase comparator and a voltage controlled oscillator for demodulating an angle-modulated wave signal. The modulated signal is separated from a composite signal picked up from a multichannel record disc on which a multiplexed direct wave signal and an angle-modulated wave signal are recorded. The output of the first phase locked loop is a demodulated signal. A second phase locked loop circuit includes a phase comparator and a voltage controlled oscillator, supplied with the separated angle-modulated wave signal and having a lock range of a width which covers and is wider than the maximum lock range width of the first phase locked loop circuit. A synchronous detector compares the phases of the angle-modulated wave signal and the output signal of voltage controlled oscillator of the second phase locked loop. The synchronous detector operates when the phase difference of the two signals deviates sufficiently from a predetermined phase difference. Means are provided for reducing or removing noise components which are developed in the demodulated signal in accordance with the output of the synchronous detector. This noise reduction or removal is provided in the first phase locked loop circuit and/or in a channel for transmitting the demodulated signal.

8 Claims, 9 Drawing Figures

MULTICHANNEL RECORD DISC REPRODUCING APPARATUS

BACKGROUND OF THE INVENTION

The present invention relates generally to multichannel record disc reproducing apparatus, and more particularly to such an apparatus for reproducing and demodulating a picked up signal after effectively reducing or removing abnormal noise therein.

A multichannel record disc is recorded on a multichannel signal produced by multiplexing a direct wave signal and an angle-modulated wave signal. This multichannel signal is picked up, and the angle-modulated wave signal is demodulated by a demodulator which, in general, uses a phase locked loop (PLL) circuit.

As is known, the width of the lock range of a PLL circuit varies in accordance with the level of the input angle-modulated wave signal. Furthermore, the frequency band width of the output demodulated signal of a PLL circuit is determined by the lock range of the PLL circuit. Accordingly, when a high level angle-modulated wave signal is introduced as input into the PLL circuit, the width of the demodulated frequency band is wide. Whereas, when a low level angle-modulated wave signal appears, the demodulated frequency band width is narrow. In this manner, the lock range of a PLL circuit varies automatically with the level of the input angle-modulated wave signal. Also, in accordance with this variation, the demodulated frequency band width of the output signal varies. Therefore, a PLL circuit having a characteristic of this nature is suitable for use in the demodulation circuit of a multichannel record disc reproducing apparatus.

In a multichannel record disc, the frequency band of the direct wave signal is in the range from 30 Hz to 15 KHz, whereas the frequency band of the angle-modulated wave signal is in the range from 20 KHz to 45 KHz, for example. Accordingly, the bands of the two signals are relatively close to each other. Therefore, if a signal has a large component, particularly in the high-frequency part of the direct wave signal, higher harmonics become mixed in the band of the angle-modulated wave signal. When these mixed higher harmonic components are vectorially added to the angle-modulated wave signal, there may be an extinction or lack of the angle-modulated signal or an extreme distortion of the angle-modulated signal.

When a signal temporarily disappears from the input angle-modulated wave signal of the PLL circuit, the PLL circuit unlocks. Furthermore, when distortion is present in the input angle-modulated wave signal, the PLL circuit may lock onto the distortion. In either case, abnormal noise of pulse form is generated in the output demodulated signal.

Accordingly, in order to eliminate or reduce this abnormal noise, the systems of U.S. Pat. Nos. 3,896,272 and 3,991,283 have been adopted. In each of these systems, a synchronous detector is supplied with the output of a voltage-controlled oscillator connected within the loop of the PLL circuit used with the input angle-modulated wave signal. Abrupt variations are detected in the phase appearing in the output of the voltage-controlled oscillator. In accordance with this detection signal and through the use of a control signal, either the loop gain of the PLL circuit or a muting circuit is controlled thereby to reduce or eliminate the generation of the abnormal noise.

However, this known system does not produce an output from the synchronous detector only when an abnormal noise is generated in the demodulated signal from the PLL circuit, as where the PLL circuit unlocks or the PLL circuit locks onto the distortion in the angle-modulated wave signal. Although abnormal noise is not produced in the demodulated output signal from the PLL circuit, a distorted output is sometimes produced at the synchronous detector so that a great phase change occurs abruptly in the angle-modulated wave signal. In such a case, the loop gain control circuit or a muting circuit operates erroneously.

More specifically, consider the demodulation problems when the angle-modulated wave signal to be demodulated is a carrier modulated by a signal having a frequency component in a middle and low frequency ranges, such as, for example, a trumpet sound. Such a waveform may be a train of pulses with steep rising leading edges and high values. Large phase changes occur abruptly in this angle-modulated wave signal because the frequency deviation is large. When the loop gain of the PLL circuit is set at a large value, the lock range is wide, and noise is readily generated. For this reason, the loop gain of the PLL circuit is set at a relatively small value. Although the resulting lock range covers the frequency band of the angle-modulated wave, it will not be remarkably wider than this.

Accordingly, when large phase changes occur abruptly in an angle-modulated wave signal supplied to the PLL circuit, the phase of the output from the voltage-controlled oscillator within the PLL circuit has a great deviation. An output is produced from the synchronous detector. However, in this case, the PLL circuit continues its normal demodulation operation and produces a normal demodulated output without unlocking because of the so-called flywheel effect. For this reason, even if the PLL circuit produces a normal demodulated output, a control signal output is produced from the synchronous detector. The loop gain of the PLL circuit, the muting circuit operation, and the like, are unnecessarily controlled.

SUMMARY OF THE INVENTION

Accordingly, it is a general object of the present invention to provide a novel and useful multichannel record disc reproducing apparatus in which the above described problems have been overcome.

Another and specific object of the invention is to provide a multichannel record disc reproducing apparatus wherein separate PLL circuits are provided for demodulation of the angle-modulated wave signal, and for detection of abnormal sound, in which the lock range is selected at a wide value. In this invention, there is no possibility of erroneous operation of the abnormal noise reducing or removing circuit even when the angle-modulated wave signal is modulated by a signal having middle and low frequency bands, as in the case of a trumpet sound, and has a pulse train wave form with a steep rising leading edge and a high value.

Still another object of the invention is to provide a multichannel record disc reproducing apparatus to obtain a control signal for abnormal sound reduction or removal in response to a signal component of a specific frequency, in the output signal of a synchronous detector, along with an additional PLL circuit for abnormal sound detection.

Other objects and further features of the invention will be apparent from the following detailed description with respect to preferred embodiments of the invention when read in conjunction with the accompanying drawings.

DETAILED DESCRIPTION

Figure 1:
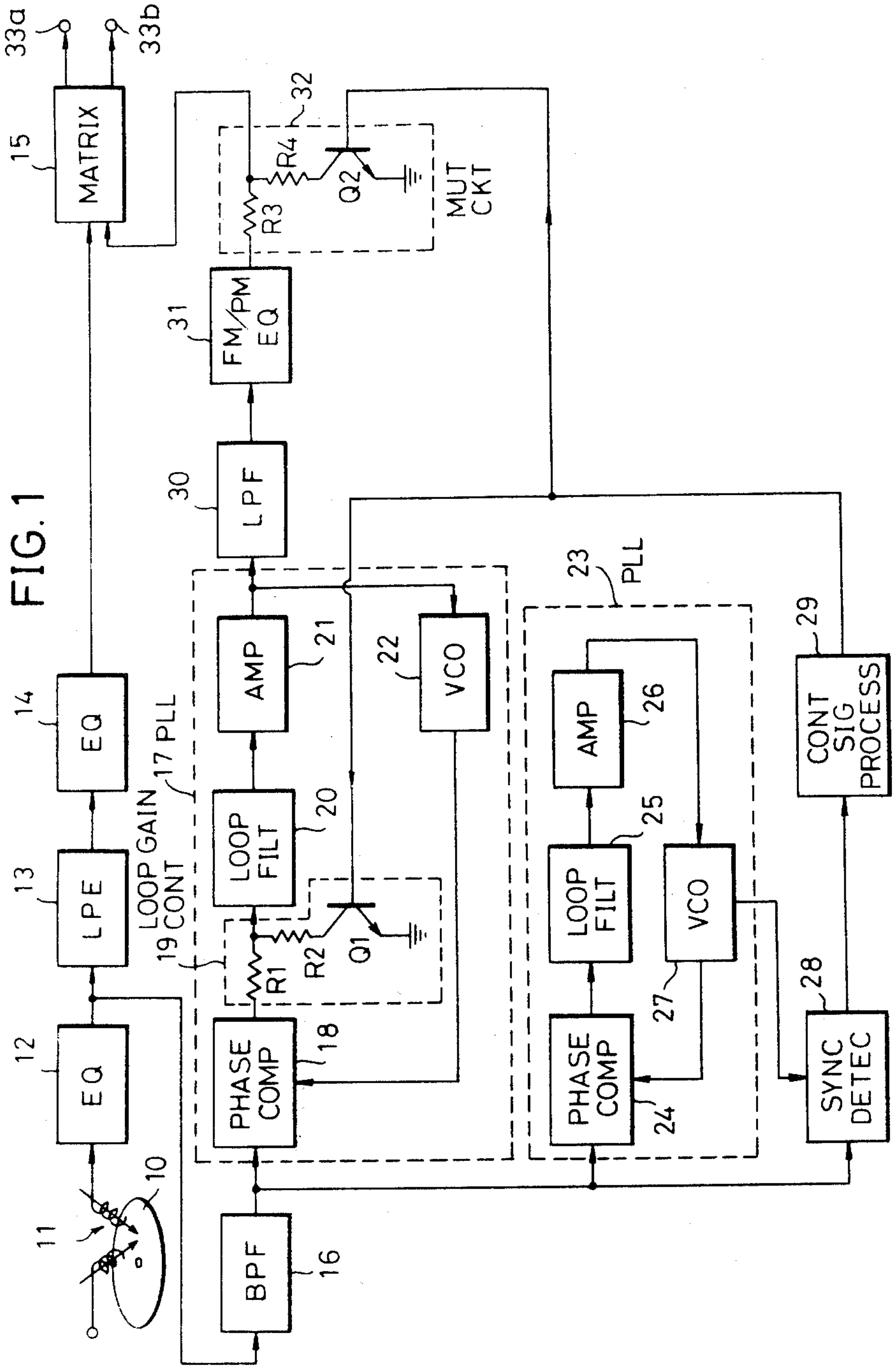
FIG. 1 is a block diagram of a first embodiment of the multichannel disc reproducing apparatus according to the present invention.
Figure 2:
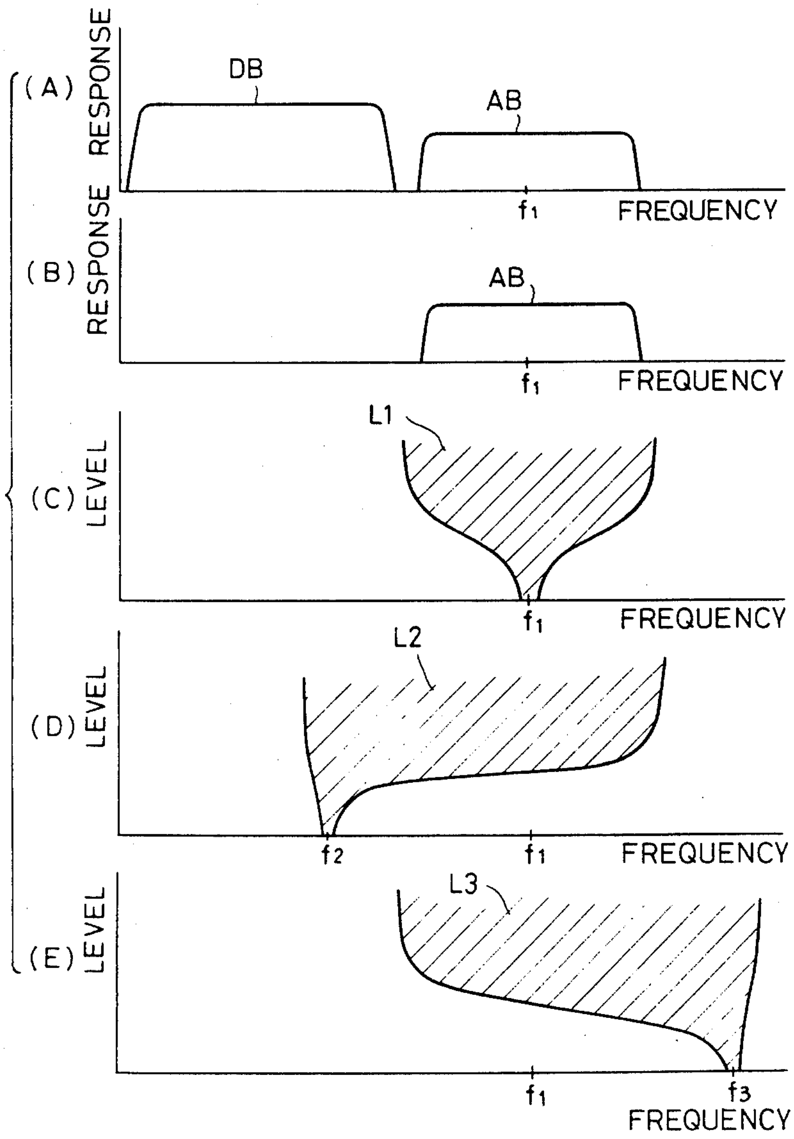
FIGS. 2(A) through 2(E) are graphs respectively indicating signal frequency bands and the lock range characteristic of a PLL circuit.

In FIG. 1, it will be seen that a multiplexed signal comprising a direct wave sum signal and an angle-modulated difference signal, derived from each pair of two channels, is recorded on each side wall of the sound groove of a four-channel record disc 10, thereby recording the signals for a total of four channels in one groove. A multiplexed signal of the direct wave sum signal DB and the angle-modulated wave difference signal AB is illustrated in FIG. 2(A). This represents the two-channel signal picked up from the left wall of the grooves of the disc 10 by a pickup cartridge 11. The signal is fed to an equalizer 12 with a turnover RIAA characteristic for equalization.

The resulting signal is fed to a low-pass filter 13 for elimination of the angle-modulated wave component and for deriving only the direct wave sum signal component DB. The direct wave sum signal is fed to a matrix circuit 15 via an equalizer 14 having the roll-off RIAA characteristic.

The output of the equalizer 12 is partly fed to a band-pass filter 16 (or a high-pass filter) having a pass-band in the approximate range from 20 KHz to 45 KHz. An angle-modulated wave difference signal AB is derived from this filter, as illustrated in FIG. 2(B). For demodulation, the angle-modulated wave difference signal is fed to a phase locked loop (PLL) circuit 17 containing a phase comparator 18, a loop gain control circuit 19, a loop filter 20 (or low-pass filter), an amplifier 21, and a voltage-controlled oscillator 22.

The demodulated output from the PLL circuit 17 is supplied to a low-pass filter 30. The unwanted components contained in the output are eliminated thereat. The output from the low-pass filter 30 is fed to the matrix circuit 15, through in succession FM/PM equalizer 31, and a muting circuit 32.

The matrix circuit 15 matrixes the direct wave sum signal from the equalizer 14 and the demodulated difference signal from the muting circuit 32. From output terminals **33*a* and 33*b*** are derived, for instance, the left front (the first channel) and the left rear (the second channel) signals, respectively.

The signal which has passed through the band-pass filter 16 is supplied, on the one hand, to the phase comparator 18 of the PLL circuit 17, and, on the other hand, to a phase comparator 24 of a PLL circuit 23 and to a synchronous detector 28. The PLL circuit 23 comprises the phase comparator 24, a loop filter 25 (or low-pass filter), an amplifier 26, and a voltage-controlled oscillator 27.

When the PLL circuit 23 is locked to an input angle-modulated wave, the phase angle between the input angle-modulated wave and the oscillation output of the voltage controlled oscillator 27 is maintained at 90°.

The voltage controlled oscillator 27 gives the synchronous detector 28 an output signal having a phase which differs by 90° from the phase of the signal supplied to the phase comparator 24. At the same time, an input angle-modulated signal from the band-pass filter 16 is being supplied to the synchronous detector 28, as described above. The synchronous detector 28 generates a positive or negative output depending, respectively, on whether the two input signals are of the same or opposite phases.

The PLL circuit 17 has a loop gain which gives a lock range $L_1$, illustrated in FIG. 2(C). The lock range $L_1$ has a maximum width which is approximately the same as or wider than the frequency band of the angle-modulated wave signal AB illustrated in FIG. 2(B). The free-running frequency of the voltage controlled oscillator 22 is equal to a carrier center frequency $f_1$ of the angle-modulated wave signal. Accordingly, the PLL circuit 17 operates in response to the normal angle-modulated wave signal supplied thereto, and the normal demodulated signal is then derived therefrom.

In contrast, the voltage controlled oscillator 27 of the PLL circuit 23 has a free-running frequency $f_2$, for instance, which is lower than the frequency $f_1$. The loop gain of the PLL circuit 23 is large. The lock range $L_2$ covers the lock range $L_1$ of the PLL circuit 17 and further has a width which is sufficiently wider than the lock range $L_1$, as shown in FIG. 2(D).

The free-running frequency of the voltage controlled oscillator 27 may be alternatively a frequency $f_3$, which is higher than the frequency $f_1$, as shown in FIG. 2(E). Similarly, in this case, the lock range $L_3$ of the PLL circuit 23 covers and is wider than the lock range $L_1$, as shown in FIG. 2(E).

The free-running frequency $f_2$ or $f_3$ of the voltage controlled oscillator 27 is preferably a frequency deviated, to a certain extent, from the free-running frequency $f_1$ of the voltage controlled oscillator 22. If the frequency $f_1$ is 30 KHz, for instance, the frequency $f_2$ is a frequency within a range from 15 KHz to 25 KHz, while the frequency $f_3$ is a frequency within a range from 35 KHz to 45 KHz. In the present embodiment, the frequency $f_1$ is 30 KHz, while the frequency $f_2$ is 15 KHz.

The PLL circuit 23 is designed so that its free-running frequency is $f_2$ and its lock range covers the lock range of the PLL circuit 17. Accordingly, the PLL 23 operates properly even for an input angle-modulated wave signal having a signal content such as a trumpet sound, for example. In this kind of a signal, the phase change occurs abruptly; however, the voltage controlled oscillator 27 of the PLL circuit 23 is capable of following and locking to the phase of the above input angle-modulated wave signal. Accordingly, in this case, the synchronous detector 28 produces no output. The demodulated signal from the PLL circuit 17 is therefore supplied, in a normal state, to the matrix circuit 15.

When the input angle-modulated wave signal disappears, both of the PLL circuits 17 and 23 unlock. Moreover, if the input angle-modulated wave signal has distortions caused by disturbance waves, the PLL circuits 17 and 23 will be locked to the distortions. When such abnormal phenomena occur, a large output signal is positively derived from the synchronous detector 28.

The signal thus derived from the synchronous detector 28 is supplied to a control signal processing circuit 29 which includes a time-constant circuit and a level setting circuit. There, it is wave formed as a control signal. The control signal from the processing circuit 29 is supplied, on the one hand, to the loop gain control circuit 19 of the PLL circuit 17. The loop gain control circuit 19 comprises resistors $R_1$ and $R_2$, and a transistor $Q_1$, the base of which is supplied with the control signal. The loop gain control circuit 19 is adapted to operate, in response to the control signal supplied thereto, to reduce the loop gain of the PLL circuit 17 and to make the lock range more narrow.

The control signal from the processing circuit 29 is supplied, on the other hand, to the base of a transistor $Q_2$ of the muting circuit 32. The muting circuit 32 comprises resistors $R_3$ and $R_4$, and the transistor $Q_2$. The muting circuit 32 attenuates the level of the demodulated signal to be supplied to the matrix circuit 15. Accordingly, the generation of abnormal noise is effectively prevented.

In this embodiment, the free-running frequency $f_2$ of the voltage controlled oscillator 27 of the PLL circuit 23 is selected, in relation to the free-running frequency $f_1$ of the voltage controlled oscillator 22 of the PLL circuit 17, so as to have a relation $f_2<f_1$ or $f_2>f_1$. However, if the frequency is has a relation $f_2=f_1$, the lock range of the PLL circuit 23 covers and is wider than the maximum lock range width of the PLL circuit 17. The object of the present invention is also attained.

FIG. 1 shows only the circuit system for the first and second channel signals (the signals recorded or the left wall of the grooves of the disc 10). Exactly the same system is duplicated for the right front (the third) and the right rear (the fourth) channel. A detailed illustration and description of this right system are omitted herein.

Figure 3:
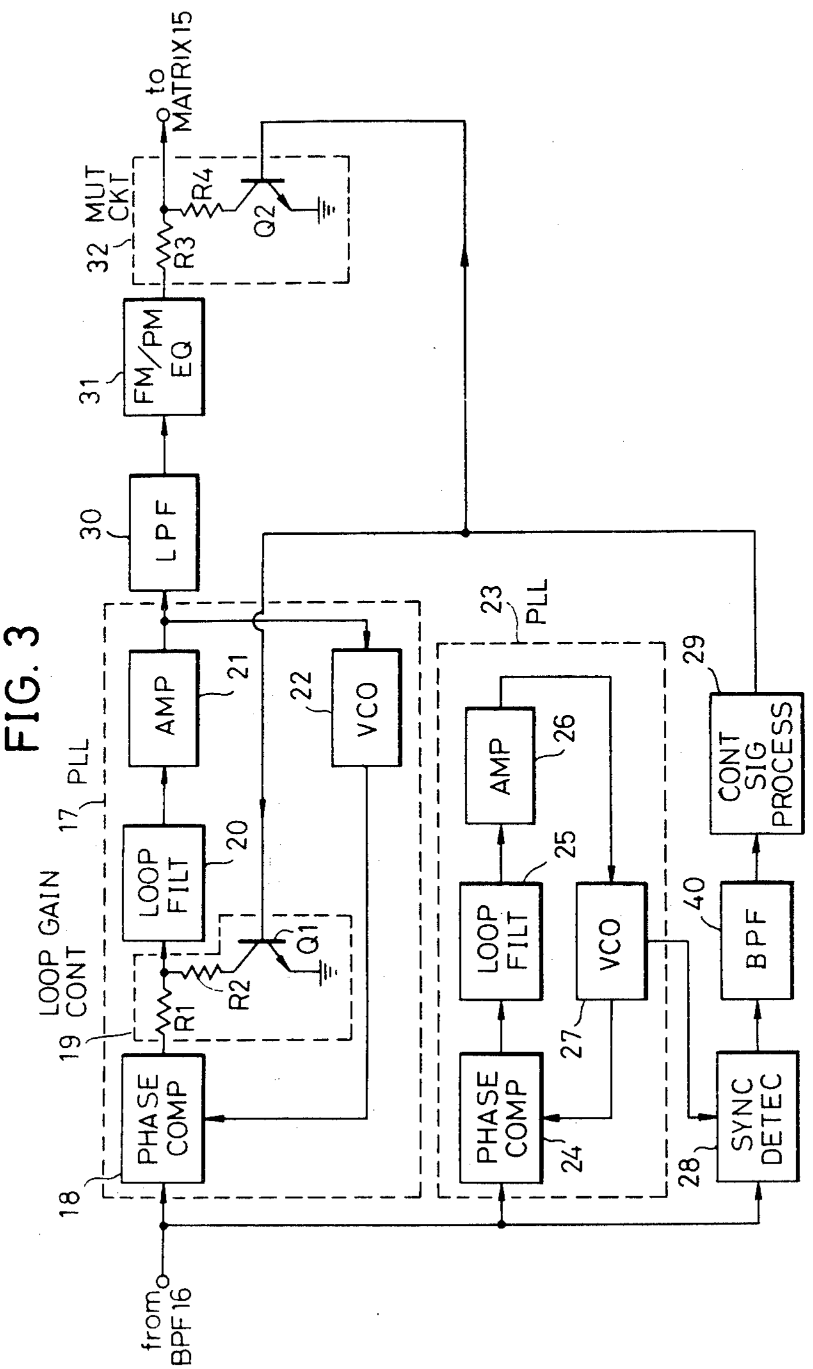
FIG. 3 is a block diagram showing a second embodiment of the multichannel record disc reproducing apparatus according to the present invention.

Next, a second embodiment of a reproducing apparatus, according to the present invention, will now be described in conjunction with FIG. 3. In FIG. 3, those parts which are the same as corresponding parts in FIG. 1 are designated by like reference numerals. The description of such parts will not be repeated.

The present embodiment has a band-pass filter 40 at a stage succeeding the synchronous detector 28 in the block diagram of the first embodiment shown in FIG. 1.

In this embodiment, the band-pass filter 40 has a filtering characteristic for passing or filtering therethrough the frequency components of 10 KHz and the vicinity thereof.

In general, the succession of a transmission system from a record disc recording system to a record disc reproducing system is non-linear. The signal demodulated by the reproducing system is subjected to amplitude modulation, which generates distortions. It has been known that a secondary harmonic distortion is most prominent among the above mentioned distortions. The energy component of the distortions is generally inclined to increase as the frequency becomes high, despite some differences which depend on the characteristics of the pickup cartridges. The energy component of the signal recorded on the multichannel record disc becomes smaller, in general, as the frequency becomes higher. These frequency characteristics of the energy components intersect in the vicinity of about 10 KHz. Accordingly, a distortion is generated in the signal reproduced from the record disc at a frequency point of about 20 KHz, which is the secondary harmonic of 10 KHz.

For this reason, the carrier of this angle-modulated wave signal is subjected to amplitude modulation due to the distortion in the vicinity of 20 KHz. Accordingly, if the carrier wave frequency is 30 KHz, the frequency component of 10 KHz, which is a frequency of the difference between the carrier frequency and the secondary harmonic frequency, is greatly exaggerated.

Figure 4A:
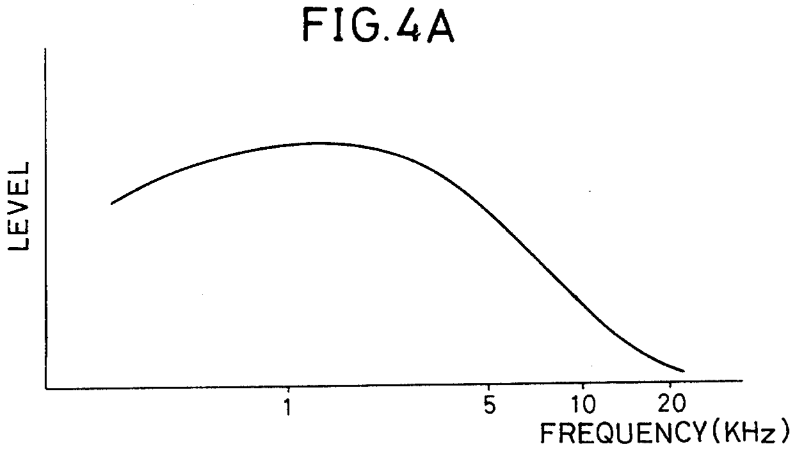
FIGS. 4A and 4B are graphs respectively indicating the frequency characteristics of the output signals of a synchronous detector.
Figure 4B:
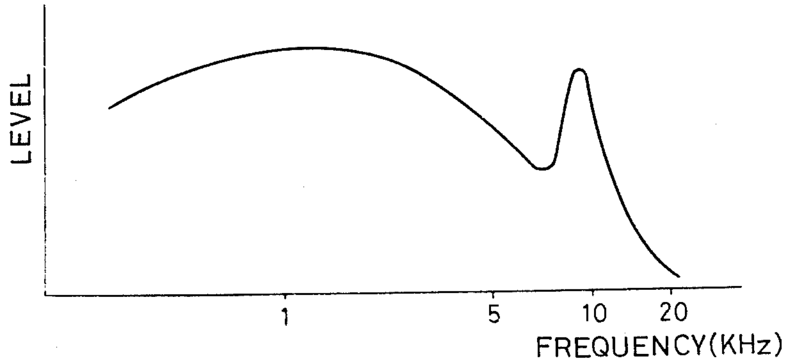

A phenomenon is observed in which a 10 KHz component of the envelope of the reproduced angle-modulated wave signal becomes extremely large when there are distortions, of all causes, in the demodulated signal. In contrast, if the demodulated signal is normal, this phenomenon never occurs even though the modulating signal is a trumpet sound, for instance, and the modulated carrier has a large frequency deviation. That is, when the input angle-demodulated wave signal is normal, the output of the synchronous detector 28 has a frequency characteristic as shown in FIG. 4A. In contrast, when the input angle-modulated wave signal includes the distortion components, the frequency characteristic of the output of the synchronous detector 28 is as shown in FIG. 4B. In FIG. 4B, it will be observed that the frequency component at 10 KHz is abnormally large. The level difference between the characteristic curves at the frequency of 10 KHz shown in FIGS. 4A and 4B is 6 dB or more, for instance.

In connection to this, the present embodiment derives a frequency component of 10 KHz by the band-pass filter 40. According to the present embodiment, there is an extremely large level difference between the signals supplied to the control signal processing circuit 29, at the time of normal operation and at the time of abnormal operation, respectively. For this reason, the threshold level of the muting circuit 32 can be easily determined, and the muting circuit 32 is caused to operate more positively.

Figure 5:
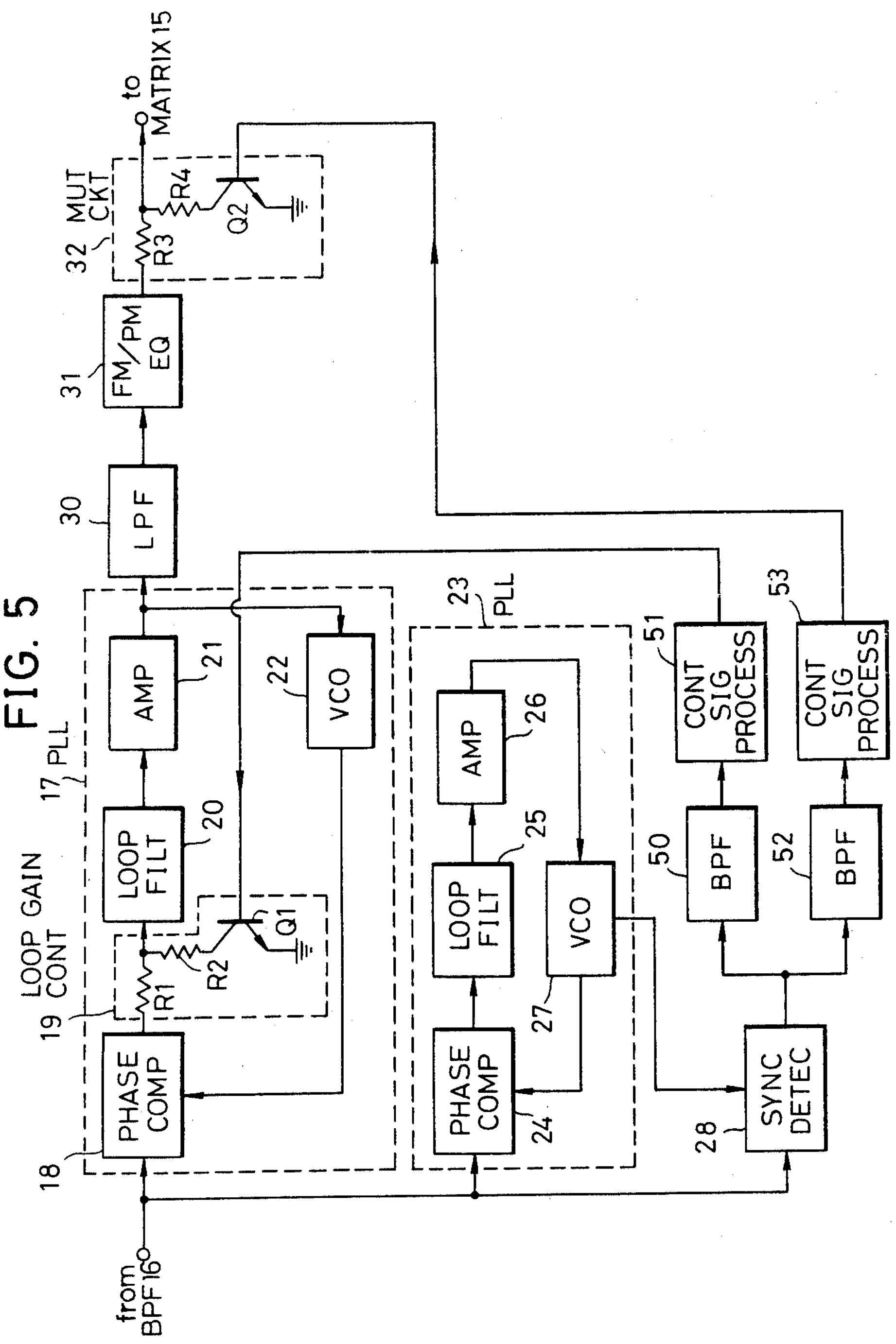
FIG. 5 is a block diagram showing a third embodiment of the multichannel record disc reproducing apparatus according to the present invention.

A third embodiment of the reproducing apparatus of the present invention will now be described in conjunction with FIG. 5, in which parts that are the same as those in FIG. 1 are designated by like reference numerals and the detailed description will be omitted.

The output of the synchronous detector 28 is supplied to both of the band-pass filters 50 and 52. The band-pass filter 50 passes a middle frequency band of signals. The band-pass filter 52 passes a high frequency band of signals. A high-pass filter may be employed instead of band-pass filter 52.

The output signal of the band-pass filter 50 is fed to a control signal processing circuit 51, for wave forming. The wave formed signal is a control signal supplied from the processing circuit 51 to the loop gain control circuit 19. The output signal of the band-pass filter 52 is fed to a control signal processing circuit 53 for wave forming. This formed signal is supplied from the processing circuit 53 to the muting circuit 32.

Figure 6:
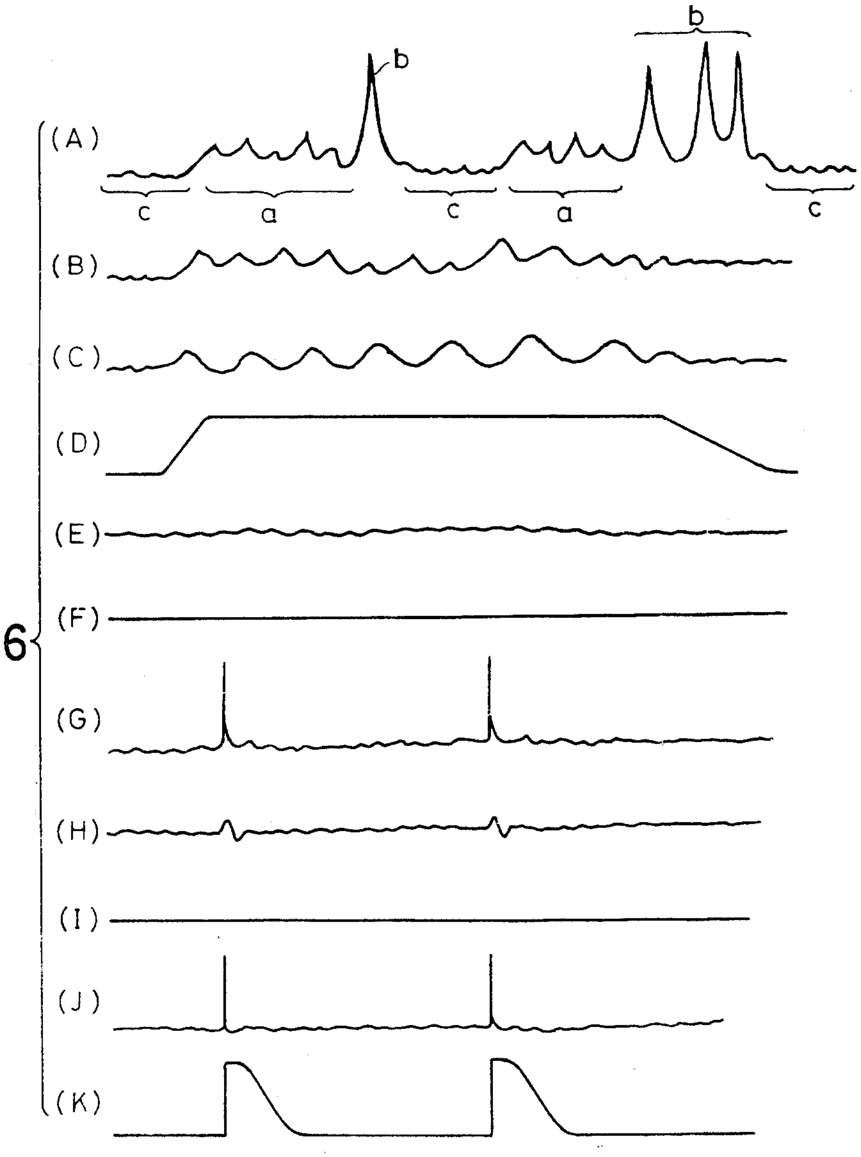
FIGS. 6(A) through 6(K) show waveforms of signals at various parts in the block diagram illustrated in FIG. 5.

The output of the synchronous detector 28 has an output voltage of a waveform as shown in FIG. 6(A). In the same figure, portions indicated by the letter a correspond to distortions generated by the playing back of a dirty or worn record disc. When such a distortion is reproduced, the sound is heard to be broken or hoarse. Portions indicated by the letter b correspond to distortions including impulsive noises which occur when there are dust particles in the sound grooves, or where the sound grooves are damaged. When such a distortion is reproduced, extreme abnormal sounds are heard in the musical sounds. The other portions indicated by the letter c correspond to normal angle-modulated wave signals with no demodulation distortion.

Among the above mentioned distortions, in the part a, abnormality accompanied by this distortion can be reduced by making a narrow lock range of the PLL circuit. This decreases the level of the high-frequency band component of the demodulated signal. If the distortion corresponding to part b has been generated, however, the abnormal sound cannot be sufficiently reduced by making the lock range of the PLL circuit more narrow, while it is required to carry out a muting operation.

Now, if the output signal of the synchronous detector 28 has a waveform as shown in FIG. 6(B) (corresponding to the portion a in FIG. 6(A)), it is supplied through the band-pass filter 50 to the control signal processing circuit 51. FIG. 6(C) shows the output of the band-pass filter 50. A control signal having a waveform which gently rises and falls with a long holding time as shown in FIG. 6(D) is derived from the control signal processing circuit 51 and supplied to the loop gain control circuit 19. The control signal controls the loop gain of the PLL circuit 17, and makes its lock range narrow. Accordingly, the demodulated output of the PLL circuit 17 is subjected to a reduction of frequency characteristics of high-frequency range, whereby distortions are reduced without deterioration of the musical sounds of the demodulated signal.

The output of the band-pass filter 52 has a waveform as shown in FIG. 6(E). No control signal is thereby derived from the control signal processing circuit 53, as shown in FIG. 6(F). For this reason, the muting circuit 32 is not in an operating state, and the signal from the FM/PM equalizer 31 is supplied to the matrix circuit 15, as it is.

In another case where the output signal of the synchronous detector 28 has a waveform shown in FIG. 6(G) (corresponding to the portion b in FIG. 6(A)) the output of the band-pass filter 50 has a waveform as shown in FIG. 6(H). No control signal is derived from the control signal processing circuit 51, as shown in FIG. 6(I). Accordingly, the loop gain control circuit 19 is not controlled, whereby the lock range of the PLL circuit 17 remains wide.

On the other hand, a signal having a waveform as shown in FIG. 6(J) is derived from the band-pass filter 52, and is supplied to the control signal processing circuit 53. As a result, a control signal having a waveform which rises steeply with a short holding time, as shown in FIG. 6(K), is derived from the processing circuit 53. The derived control signal is supplied to the muting circuit 32. The muting circuit 32 operates, during the time when the control signal in FIG. 6(K) is being applied thereto, to decrease the level of the demodulated signal derived from the PLL circuit 17 and passed through the FM/PM equalizer 31, or to interrupt the above demodulated signal. Accordingly, the pulse noises are eliminated or removed effectively.

Figure 7:
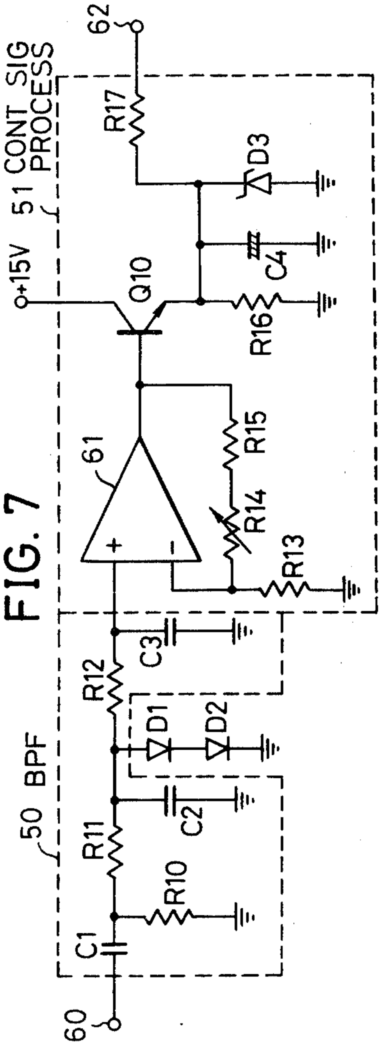
FIG. 7 and FIG. 8 are respectively circuit diagrams of one specific embodiment of a circuit of an essential part of the block diagram illustrated in FIG. 5.

A specific embodiment of the band-pass filter 50 and the control signal processing circuit 51 is illustrated in FIG. 7. The band-pass filter 50 comprises resistors $R_{10}$, $R_{11}$, and $R_{12}$, and capacitors $C_1$, $C_2$, and $C_3$. An input terminal 60 receives the output signal of the synchronous detector 28. The band-pass filter 50 in this embodiment has a passband in the frequency range from 1 KHz to 3 KHz. The control signal processing circuit 51 comprises an amplifier 61, resistors $R_{13}$ through $R_{17}$, a transistor $Q_{10}$, a capacitor $C_4$, and a diode $D_3$. The control signal led out through an output terminal 62 is supplied to the loop gain control circuit 19.

Figure 8:
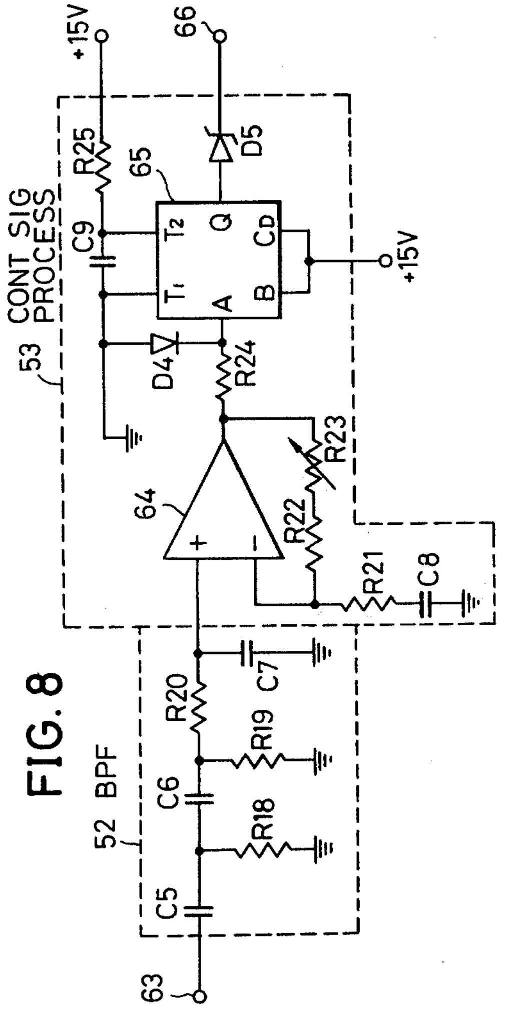

A specific embodiment of the band-pass filter 52 and the control signal processing circuit 53 is illustrated in FIG. 8. The band-pass filter 52 comprises resistors $R_{18}$, $R_{19}$, and $R_{20}$, and capacitors $C_5$, $C_6$, and $C_7$. An input terminal 63 receives the output signal of the synchronous detector 28. The band-pass filter 52 in this embodiment has a passband in the frequency range which is from 8 KHz to 13 KHz. The control signal processing circuit 53 comprises an amplifier 64, resistors $R_{21}$ through $R_{25}$, capacitors $C_8$ and $C_9$, diodes $D_5$ and $D_6$, and a re-triggerable one-shot multivibrator in a form of an integrated circuit 65. The control signal led out through an output terminal 66 is supplied to the muting circuit 32.

Further, this invention is not limited to these embodiments. Variations and modifications may be made without departing from the scope and spirit of the invention.

What is claimed is:

1. A multichannel record disc reproducing apparatus comprising:

first phase locked loop circuit means including phase comparator means and voltage controlled oscillator means for demodulating an angle-modulated wave signal which is separated from a signal picked up from a multichannel record disc on which a direct wave signal and an angle-modulated wave signal are recorded in a multiplexed state, the output of said first phase locked loop circuit means being a demodulated signal, said first phase locked loop circuit means having a maximum lock range width which is the same as or slightly wider than the frequency band of the angle-modulated wave signal;

second phase locked loop circuit means including phase comparator means and voltage controlled oscillator means, said second phase locked loop circuit means being supplied with said separated angle-modulated wave signal and having a lock range with a width which covers and is wider than the maximum lock range width of the first phase locked loop circuit means;

synchronous detector means for comparing the phases of said angle-modulated wave signal and the output signal of said voltage controlled oscillator means of said second phase locked loop circuit means and operating when the phase difference of said two signals deviates from a predetermined phase difference to produce an output in accordance with the deviation of the phase difference; and means for reducing or removing noise components which are developed in the demodulated signal in accordance with the output of said synchronous detector means, said reducing or removing means being in the first phase locked loop circuit means or in a channel for transmitting the demodulated signal.

2. A multichannel record disc reproducing apparatus as claimed in claim 1 which further comprises band-pass filter means for filtering a signal component of a predetermined frequency band out of the output signal of the synchronous detector means and supplying said filtered signal component to said noise reducing or removing means.

3. A multichannel record disc reproducing apparatus as claimed in claim 2 in which a carrier center frequency of said angle-modulated wave signal is 30 KHz; and said band-pass filter means has a band-pass characteristic for filtering a signal component of a frequency of 10 KHz.

4. A multichannel record disc reproducing apparatus as claimed in claim 1 in which said noise reducing or removing means comprises loop gain control means in the first phase locked loop circuit means for controlling a loop gain of the first phase locked loop circuit means; and muting means in a channel for transmitting the demodulated output signal from the first phase locked loop circuit means for controlling the output level of the demodulated signal, and which further comprises first filter means for filtering out a middle frequency band from the output signal of the synchronous detector means, and supplying the output as a control signal to said loop gain control means; and second filter means for filtering out a high frequency band from the output signal of the synchronous detector means, and supplying the output as a control signal to the muting means.

5. A multichannel record disc reproducing apparatus as claimed in claim 4 in which a carrier center frequency of said angle-modulated wave signal is 30 KHz; said first filter means filtering a signal component within a frequency band of 1 KHz to 3 KHz; and said second filter means filtering a signal component within a frequency band of 8 KHz to 13 KHz.

6. A multichannel record disc reproducing apparatus as claimed in claim 1 in which the voltage controlled oscillator means in said first phase locked loop circuit means has a free running frequency which is equal to a carrier center frequency of the angle-modulated wave signal; and the voltage controlled oscillator means of said second phase locked loop circuit means has a free running frequency which is different from said carrier center frequency.

7. A multichannel record disc reproducing apparatus as claimed in claim 6 in which the carrier center frequency of said angle-modulated wave signal is 30 KHz; and the free running frequency of the voltage controlled oscillator means of said second phase locked loop circuit means is a frequency within a frequency range between 15 KHz and 25 KHz.

8. A multichannel record disc reproducing apparatus as claimed in claim 6 in which the carrier center frequency of said angle-modulated wave signal is 30 KHz; and the free running frequency of the voltage controlled oscillator means of said second phase locked loop circuit means is a frequency within a frequency range between 35 KHz and 45 KHz.

* * * * *